United States Patent
Schmid et al.

(10) Patent No.: US 8,330,148 B2
(45) Date of Patent: Dec. 11, 2012

(54) ELECTRIC ORGANIC COMPONENT AND METHOD FOR THE PRODUCTION THEREOF

(75) Inventors: Guenter Schmid, Hemhofen (DE);
Britta Goeoetz, Regensburg (DE);
Karsten Heuser, Erlangen (DE);
Wolfgang Scherer, Leitershofen (DE);
Rudolf Herrmann, Augsburg (DE);
Ernst-Wilhelm Scheidt, Diedorf/Biburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 259 days.

(21) Appl. No.: 12/529,618

(22) PCT Filed: Feb. 5, 2008

(86) PCT No.: PCT/DE2008/000213
§ 371 (c)(1),
(2), (4) Date: Nov. 17, 2009

(87) PCT Pub. No.: WO2008/106917
PCT Pub. Date: Sep. 12, 2008

(65) Prior Publication Data
US 2010/0084639 A1    Apr. 8, 2010

(30) Foreign Application Priority Data

Mar. 2, 2007 (DE) .......... 10 2007 010 243
May 23, 2007 (DE) .......... 10 2007 023 876

(51) Int. Cl.
*H01L 51/30* (2006.01)

(52) U.S. Cl. .......... 257/40; 257/E51.027; 257/E21.04; 438/99

(58) Field of Classification Search .......... 257/40, 257/E21.04; 25/E51.027; 438/99
See application file for complete search history.

(56) References Cited

U.S. PATENT DOCUMENTS

| | | | |
|---|---|---|---|
| 6,208,221 B1 | 3/2001 | Pelz et al. | |
| 6,365,762 B1 | 4/2002 | Fischer et al. | |
| 6,869,699 B2 | 3/2005 | Klubek et al. | |
| 7,345,301 B2 | 3/2008 | Gerhard et al. | |
| 7,528,545 B2 | 5/2009 | Liao et al. | |
| 7,566,971 B2 * | 7/2009 | Matsuzaki | 257/750 |
| 2004/0013905 A1 | 1/2004 | Tsuboyama et al. | |
| 2005/0173700 A1 | 8/2005 | Liao et al. | |

(Continued)

FOREIGN PATENT DOCUMENTS

DE    103 43 910 A1    5/2005

(Continued)

OTHER PUBLICATIONS

Paula Ferreira, Bidentate Lewis Base Adducts of Methyltrioxorhenium (VII) and their Application in Catalytic Epoxidation, Sep. 14, 2001, Inorg.Chem.2001, 40, 5834-5841.*

(Continued)

*Primary Examiner* — Marc Armand

(74) *Attorney, Agent, or Firm* — Slater & Matsil, L.L.P.

(57) ABSTRACT

An electric organic component and a method for the production thereof is disclosed. The component includes a substrate, a first electrode, a first electrically semiconductive layer on the first electrode, an organic functional layer on the first electrically semiconductive layer and a second electrode on the organic functional layer. The first or the second electrode may be arranged on the substrate. The electrically semiconductive layer is doped with a dopant which comprises rhenium compounds.

30 Claims, 6 Drawing Sheets

U.S. PATENT DOCUMENTS

| | | | |
|---|---|---|---|
| 2006/0076537 | A1 | 4/2006 | Christou et al. |
| 2006/0119258 | A1* | 6/2006 | Sakata et al. ............... 313/504 |
| 2006/0208221 | A1* | 9/2006 | Gerhard et al. .......... 252/301.16 |
| 2006/0255332 | A1 | 11/2006 | Becker et al. |
| 2007/0037010 | A1 | 2/2007 | Vestweber et al. |
| 2007/0040161 | A1* | 2/2007 | Kumaki et al. ................ 257/13 |
| 2007/0114915 | A1 | 5/2007 | Gerhard et al. |
| 2007/0164278 | A1* | 7/2007 | Lee et al. ........................ 257/40 |
| 2007/0182317 | A1* | 8/2007 | Kido et al. ................... 313/504 |
| 2007/0194692 | A1 | 8/2007 | Nomura et al. |
| 2008/0191611 | A1 | 8/2008 | Iwaki et al. |
| 2009/0146164 | A1 | 6/2009 | Tierney et al. |
| 2009/0206731 | A1 | 8/2009 | Leadbeater et al. |

FOREIGN PATENT DOCUMENTS

| | | |
|---|---|---|
| DE | 103 55 380 A1 | 6/2005 |
| DE | 103 55 381 A1 | 6/2005 |
| DE | 103 55 358 A1 | 7/2005 |
| EP | 1 463 130 A2 | 9/2004 |
| EP | 1 881 543 A1 | 1/2008 |
| WO | WO 02/31896 A2 | 4/2002 |
| WO | WO 03/079737 A2 | 9/2003 |
| WO | WO 2005/078820 A1 | 8/2005 |
| WO | WO 2006/059734 A1 | 6/2006 |
| WO | WO 2006/070184 A1 | 7/2006 |
| WO | WO 2006/070185 A1 | 7/2006 |
| WO | WO 2006/101016 A1 | 9/2006 |
| WO | WO 2006/121105 A1 | 11/2006 |

OTHER PUBLICATIONS

M.A. Pietsch, LReO3 Epoxidizes, cis-Dihydrolater and Cleaves as well as Alkenylates aldehydes: toward an understanding of Why, Organomettallic 1998,17,2716-2719.*

Hollemann, A.F., "Lehrbuch der anorganischen Chemie", The Manganese Group, 1976, pp. 911-914.

Kühn, F. E., "Organorheniumoxide—Synthesen, Eigenschaften, Abbauwege", Nov. 29, 1994, pp. 29-31, 34-35, 58-63, 98-101, 111-113, 118-119, 126-127, 132-133, 144-145, München, Germany.

Zhou, X., "Enhanced Hole Injection into Amorphous Hole-Transport Layers of Organic Light-Emitting Diodes Using Controlled p-Type Doping", Advanced Functional Materials, Aug. 2001, 5 pgs., vol. 11, No. 4.

Endo, J., "Organic Electroluminescent Devices with a Vacuum-Deposited Lews-Acid-Doped Hole-Injecting Layer", The Japan Society of Applied Physics, Mar. 15, 2002, pp. L358-L360, vol. 41, part 2, No. 3B.

Zhou, X., "Low-Volatage Inverted Transparent Vacuum Deposited Organic Light-Emitting Diodes Using Electrical Doping", American Institute of Physics, Applied Physics Letters, Jul. 29, 2002, pp. 922-924, vol. 81, No. 5.

Zhou, X., "High-Efficiency Electrophosphorescent Organic Light-Emitting Diodes with Double Light-Emitting Layers" American Institute of Physics, Applied Physics Letters, Nov. 18, 2002, pp. 4070-4072, vol. 81, No. 21.

Kurata, T., "Charge-Transporting Property of Polymer Films Doped with Organic Stable Radicals", Journal of Photopolymer Science and Technology, 2003, pp. 297-298, vol. 16, No. 2.

Gao, W., "Controlled $p$ Doping of the Hole-Transport Molecular Material N,N'—diphenyl—N,N'—bis (1-naphthyl)—1,1'—biphenyl—4, 4'—diamine with tetrafluorotetracyanoquinodimethane", American Institute of Physics, Journal of Applied Physics, Jul. 1, 2003, pp. 359-366, vol. 94, No. 1.

He, G., "Very High-Efficiency and Low Voltage Phosphorescent Organic Light-Emitting Diodes Based on a $p$-$i$-$n$ Junction", American Institute of Physics, Journal of Applied Physics, May 15, 2004, pp. 5773-5777, vol. 95, No. 10.

He, G., "High-Efficiency and Low-Voltage $p$-$i$-$n$ Electrophosphorescent Organic Light-Emitting Diodes with Double-Emission Layers", American Institute of Physics, Journal of Applied Physics, Oct. 25, 2004, pp. 3911-3913, vol. 85, No. 17.

Harada, K., et al., "Organic Homojunction Diodes with a High Built-in Potential: Interpretation of the Current-Voltage Characteristics by a Generalized Einstein Relation", The American Physical Society, Physical Review Letters, Jan. 28, 2005, pp. 1-4, vol. 94.

Miller, R., et al., "Poly-MTO, $\{(CH_3)_{0.92}ReO_3\}\infty$, a Conducting Two-Dimensional Organometallic Oxide", Feb. 24, 2006, pp. 1-15. Physical Review B 73, American institue of Physics.

Herrmann, R., "Ceramic Methyltrioxorhenium", Inorganica Chimica Acta, Elsevier, Dec. 2006, pp. 4779-4788,vol. 359, Issue 15.

* cited by examiner

ELECTRIC ORGANIC COMPONENT AND METHOD FOR THE PRODUCTION THEREOF

This patent application is a national phase filing under section 371 of PCT/DE2008/000213, filed Feb. 5, 2008, which claims the priority of German patent applications 10 2007 010 243.9, filed Mar. 2, 2007 and 10 2007 023 876.4, filed May 23, 2007, each of which is incorporated herein by reference in its entirety.

TECHNICAL FIELD

The invention relates to an electric organic component with a first electrically semiconductive layer and a method for the production thereof.

BACKGROUND

Electric organic components, such as, for example, organic light-emitting diodes, with organic functional layers exhibit an efficiency and a service life which are inter alia dependent on how well charge carrier injection from the electrodes into the organic functional layers proceeds.

SUMMARY

In one aspect the invention provides an electric organic component which permits improved charge carrier injection from an electrode into an organic functional layer.

According to one exemplary embodiment of the invention, an electric organic component has a first electrically semiconductive layer which is doped with a dopant which contains rhenium compounds. Such an electric organic component comprises a substrate, a first electrode, a first electrically semiconductive layer on the first electrode, an organic functional layer on the electrically semiconductive layer, and a second electrode on the organic functional layer. Either the first or the second electrode may be arranged on the substrate. Thanks to doping of the first electrically semiconductive layer with a dopant which comprises rhenium compounds, higher efficiency of the electric organic component may be achieved. Furthermore, the service life of the electric organic component may be increased thereby and no restriction is any longer necessary with regard to the materials for the first electrode. The doping with rhenium compounds is furthermore stable. The inventors have found that, by doping the first electrically semiconductive layer with rhenium compounds, the voltage drop between the first electrode and the organic functional layer may be reduced. Furthermore, good ohmic contact between the first electrode and the organic functional layer may be produced thereby.

In relation to the sequence of layers in the electric organic component, the term "on" means that the electrically semiconductive layer may, for example, be located in direct contact with the first electrode, but also that still further layers may be present between the first electrode and the electrically semiconductive layer.

According to a further development of the invention, the electrically semiconductive layer comprises a matrix material in which the dopant is present. The matrix material may furthermore be p-doped by the dopant. It is possible in this manner to produce a positive charge or partial charge in the energy levels which effect charge carrier transport. In the case of p-doping, the lowest unoccupied molecular orbital (LUMO) of the dopant may here be located energy-wise close to or even below the highest occupied molecular orbital (HOMO) of the matrix material, with the consequence that an electron passes over from the HOMO of the matrix material to the LUMO of the dopant so creating a positive charge or partial charge in the matrix material.

According to a further embodiment of the invention, the matrix material is a hole- or defect electron-transporting material. These matrix materials contain, for example, nitrogen, oxygen, sulfur, selenium, phosphorus and arsenic groups, and any desired combinations thereof, which can readily transfer electrons or negative partial charges onto a p-dopant.

The matrix material may furthermore be selected from a group which comprises phenanthroline derivatives, imidazole derivatives, thiazole derivatives, oxadiazole derivatives, phenyl-containing compounds, compounds with fused aromatics, carbazole-containing compounds, fluorene derivatives, spirofluorene derivatives and pyridine-containing compounds and any desired combinations of the stated materials. One example of a phenanthroline derivative is the compound 4,7-diphenyl-1,10-phenanthroline (Bphen) shown in formula 1:

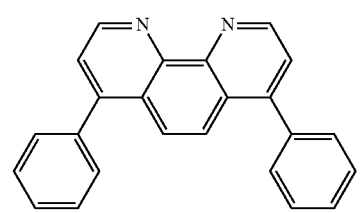

Formula 1

Another example of a phenanthroline derivative is the compound 2,9-dimethyl-4,7-diphenyl-1,10-phenanthroline (BCP) shown in formula 2:

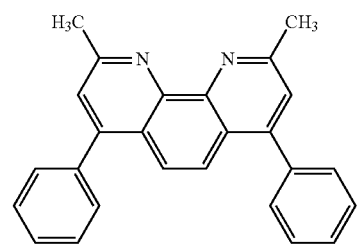

Formula 2

One example of imidazole derivatives is 1,3,5-tris-(1-phenyl-1H-benzimidazol-2-yl)-benzene (TPBi), one example of triazole derivatives is 3-phenyl-4-(1'-naphthyl)-5-phenyl-1,2,4-triazole (TAZ). One example of a usable oxazole derivative is ((2,4-biphenylyl)-5-(4-tert-butylphenyl)-1,3,4-oxadiazole) (Bu-PBD). Examples of phenyl-containing compounds and compounds with fused aromatics are naphthyl-phenyl-diamine (NPD), (4,4'-bis(2,2-diphenyl-ethen-1-yl)-diphenyl) (DPVBi), rubrene, (N,N'-bis(naphthalen-1-yl)-N,N'-bis(phenyl)benzidine) (α-NPD=NPB), (4,4',4''-tris(N-(naphth-1-yl)-N-phenyl-amino)triphenylamine) (1-TNATA). Examples of usable carbazole-containing compounds are not only (4,4'-bis(9-ethyl-3-carbazovinylene)-1,1'-biphenyl) (BCzVBi) but also smaller carbazole derivatives such as, for example, (4,4'-bis(carbazol-9-yl)biphenyl) (CBP). As has already been stated above, these compounds have donor groups such as, for example, nitrogen, oxygen, sulfur or phosphorus, which are particularly suitable for doping with rhenium compounds. The rhenium compounds as a Lewis acid may furthermore polarize the aromatics present in the matrix material and so bring about doping, in particular p-doping.

The rhenium compounds may comprise rhenium oxo compounds.

According to a further embodiment, the rhenium compounds are Lewis acids and may be selected from a group which comprises rhenium oxides, organometallic derivatives of rhenium oxides, rhenium oxyhalides and mixtures thereof. These compounds are generally relatively strong Lewis acids with a slightly oxidizing nature. A low oxidizing action ensures that the organic matrix is not irreversibly attacked. The compounds are moreover readily sublimable and so processable at temperatures of 200 to 300° C. due to their relatively low molecular weight and their non-polymeric nature.

In a further embodiment, the dopant comprises $Re_2O_7$ (rhenium heptoxide). $Re_2O_7$ is also a relatively strong Lewis acid with a slightly oxidizing nature.

In a further embodiment, the dopant comprises an $ReO_3$ unit, to which is bound a residue M, which may be organic. The $ReO_3$ unit has a low oxidizing power, such that it is stable in conjunction with carbon skeletons.

Residue M may furthermore be σ-bound to the $ReO_3$ unit. Thanks to the extraordinary redox stability of the $ReO_3$ unit, an organometallic compound with a σ-bound carbon skeleton is stable. An $ReO_3$ unit to which an organic residue M is bound is furthermore suitable for the doping action as it has a particular Lewis-acidic nature.

Residue M is favorably selected from a group which comprises branched or unbranched saturated aliphatic groups, branched and unbranched unsaturated aliphatic groups, aromatics, anions of carboxylic acids, halogens, stannyl residues and silyl residues. The saturated or unsaturated aliphatic groups may, for example, comprise not only methyl, ethyl, and propyl groups, but also substituted aliphatics such as, for example, benzyl or fluoro aliphatics. Possible examples of aromatics are phenyl, indenyl and mesityl. Acetate, trifluoroacetate and toluenesulfonate are examples of anions of carboxylic acids or organic acids. An example of a usable silyl residue is trimethylsilyl, while examples of usable halogens are chloride, bromide and iodide. These residues M are capable of entering into a stable σ-bond with the $ReO_3$ unit. The aliphatic groups, the aromatics and the anions of carboxylic acids may moreover comprise further substituents. These favorably comprise donor substituents, such as, for example, amines, phosphanes or thiols. These substituents may enhance the p-doping action of the dopant.

In a further embodiment, residue M may be π-bound to the $ReO_3$ unit. Residue M may furthermore comprise unsubstituted or substituted cyclopentadienyl, which has the structural formula $(C_5R_xH_{5-x})$, where x=1-5. R may here comprise substituents which are mutually independently an alkyl residue, e.g. methyl or ethyl residue, or an aryl residue, e.g., phenyl residue. The rhenium oxides with π-bound organic residues M may also enter into stable compounds with the matrix material and be Lewis-acidic.

According to a further embodiment, the dopant and the matrix material form a complex. Formula 3 illustrates the doping mechanism by way of example:

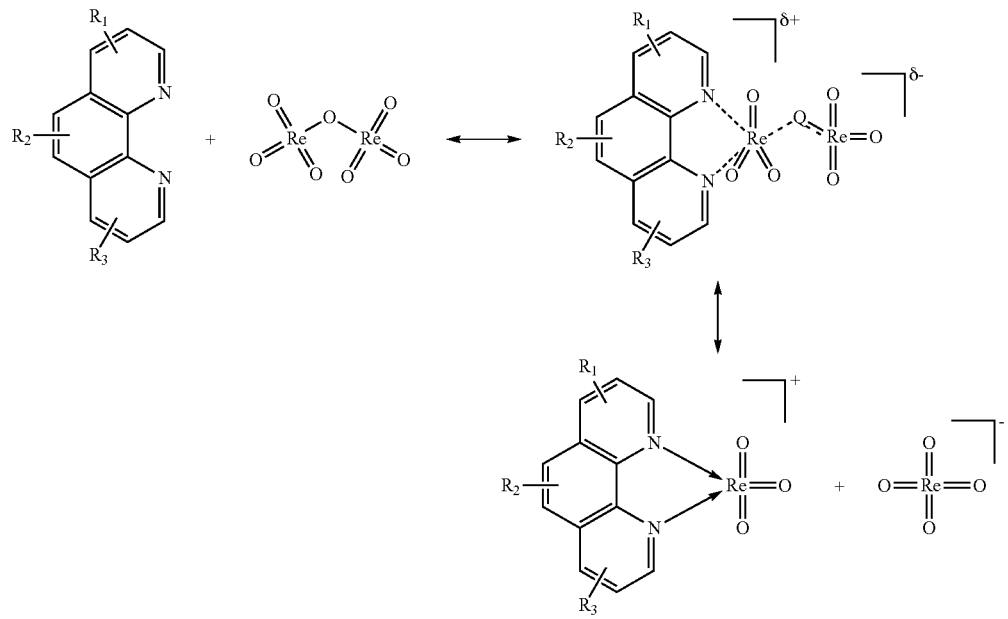

Formula 3

This shows the boundary structures of the doping mechanism. In this example, the matrix is a phenanthroline derivative which may be substituted as desired with $R_1$, $R_2$ and $R_3$ and further residues, while the dopant is $Re_2O_7$. A positive partial charge $\delta^+$ is transferred onto the phenanthroline-based matrix, whereby it is p-doped. Since the two rhenium atoms are located in the immediate vicinity of the matrix, they are capable of combining or cleaving reversibly, redox-neutrally or heterolytically by means of the oxygen bridge. The particular thermodynamic stability of the perrhenate anion $ReO_4^-$ additionally promotes the doping action.

The doping action of the $ReO_3$ unit with σ- or π-bound carbon skeletons is shown by

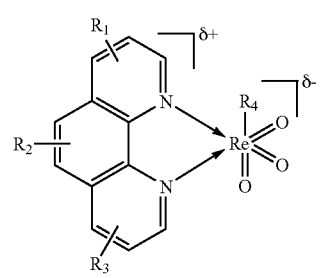

Formula 4 way of example in formula 4.

The residues $R_1$, $R_2$ and $R_3$ denote the substitution pattern on the aromatics by way of example. More or fewer substituents may also be present. There is no limitation on the selection of substituents. The ReO$_3$ unit with σ- or π-bound carbon skeletons also form stable complexes which are stabilized with the matrix material via the partial charges δ$^+$ and δ$^-$. The complexes of the formula 3 and of the formula 4 are thermally stable up to approx. 400° C. and are therefore well suited to a doping function in electric organic components, even when these are operated at elevated temperatures. The molar ratio of matrix to dopant may here be varied between 0.001 and 1.

In a further embodiment, the electrically semiconductive layer comprises a charge transport/charge injection layer or the electrically semiconductive layer has the function of a charge transport/charge injection layer. The electrically semiconductive layer is capable of transporting charges away from or to the first electrode. The charge transport/injection layer may furthermore be a hole transport/hole injection layer. In this case, positive charges may be transported from the first electrode to the organic functional layer provided that the first electrode is connected as the anode.

In a further embodiment, the first electrode may comprise an anode or be connected as the anode. The material of the first electrode may furthermore be selected from a group which comprises metals and the alloys thereof, noble metals and the alloys thereof, metal oxides and doped polymers. As a result of the doping, the material for the anode is not restricted to materials with a particularly high work function. Thus, apart from classic anode materials such as, for example, the noble metals Au, Pd, Pt or the alloys thereof, oxide conductors such as ITO (indium-tin oxide) or doped polymers, such as poly(3,4-ethylenedioxythiophene) doped with polystyrenesulfonic acid or polyaniline doped with camphorsulfonic acid, any desired metals such as stainless steel or aluminum or aluminum alloys may be suitable for the anode.

In a further embodiment, the component is selected from a group which comprises field-effect transistors, solar cells and photodetectors. The component may furthermore comprise a light-emitting diode. Doping of the electrically semiconductive layer in a light-emitting diode may lead to increased luminescence, efficiency and service life.

In a further embodiment, the organic functional layer of the light emitting-diode comprises a radiation-emitting layer, which may, for example, emit light in the visible wavelength range. In this case, when an electric field is applied to the first and second electrode, radiation is emitted from the electroluminescent organic functional layer as a result of the recombination of holes and electrons (electroluminescence). Depending on which of the electrodes is of transparent construction, light may be emitted upwards or downwards.

A second electrically semiconductive layer may furthermore be present in the electric organic component between the organic functional layer and the second electrode. In this manner, charge transport from the second electrode towards the organic functional layer may also be improved on the second electrode by favorable doping of the second electrically semiconductive layer. A zero or only slight voltage drop may here occur at the doped electric semiconductive layer, such that charge transport into the particular adjacent layer may be improved.

The invention furthermore relates to a method for producing an electric component with the above-stated features. The method comprises the method steps A) providing a substrate, and B) producing a functional layer arrangement on the substrate. The layer arrangement here comprises a first electrode, a first electrically semiconductive layer with rhenium compounds as dopants arranged on the first electrode, an organic functional layer arranged on the first electrically semiconductive layer and a second electrode arranged on the functional layer. In a further embodiment, method step B) comprises method steps B1) producing the first electrode on the substrate, B2) producing the first electrically semiconductive layer with rhenium compounds, for example, rhenium oxo compounds, as dopants on the first electrode, B3) producing the organic functional layer on the first electrically semiconductive layer and B4) producing a second electrode on the organic functional layer.

Furthermore, in method step B2) of the method, the dopant and a matrix material may be deposited simultaneously on the first electrode. In a further embodiment, the ratio between dopant and matrix material is established in method step B2) by means of the ratio between the deposition rate of the dopant and the deposition rate of the matrix material. The ratio of matrix material to dopant may accordingly be varied at will between 0.001 and 1. Furthermore, in method step B2), the molar ratio of matrix material to dopant may be varied during production of the electrically semiconductive layer, such that a gradient of the molar ratio of matrix material to dopant is obtained within the deposited layer. Conductive functions in the electrically semiconductive layer may accordingly be established as a function of layer thickness. A complex of dopant and matrix material may furthermore be deposited as the first electrically semiconductive layer in method step B2).

In a further embodiment, the semiconductive layer is deposited with a layer thickness of 30 nm in method step B2). A first undoped electrically semiconductive layer may furthermore be deposited in a method step C1). An undoped electrically semiconductive layer may accordingly be produced over the electrically semiconductive doped layer, which undoped layer prevents the dopant from impairing the functioning of the organic functional layer. The first undoped electrically semiconductive layer may furthermore be deposited with a layer thickness of 10 nm in method step C1). In a further embodiment, further functional layers may be produced on the first electrically semiconductive layer in a method step C2). The electric organic component may accordingly be constructed as a function of the intended application.

A glass substrate may furthermore be provided in method step A). When a light-emitting diode is used as the organic electric component, radiation, for example, light, may be emitted through the substrate.

In method step B2), the first electrode may furthermore be connected as the anode. In a further embodiment, the first electrode may be connected as the cathode in method step B2). The sequence of layers in the organic electric component may thus be varied as required.

BRIEF DESCRIPTION OF THE DRAWINGS

The figures and exemplary embodiments are intended to explain the invention in greater detail.

DETAILED DESCRIPTION OF ILLUSTRATIVE EMBODIMENTS

Figure 1:
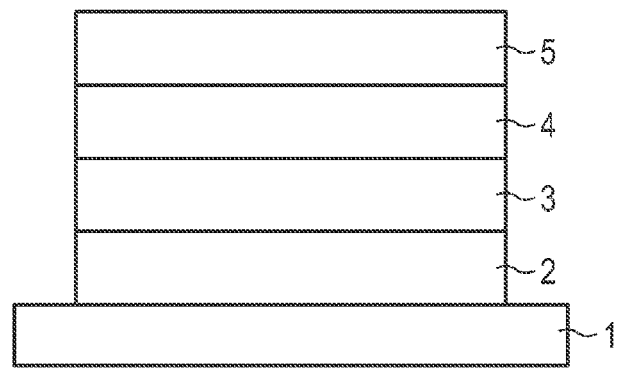
FIG. 1 shows a schematic side view of the electric organic component.

FIG. 1 shows the schematic side view of an embodiment of the electric organic component according to the invention. On a substrate 1 is located a first electrode 2, on this the first electric semiconductive layer 3, thereon an organic functional layer 4 and finally a second electrode 5. The substrate 1 may, for example, be a glass substrate. The first or second electrode may be of a material which is selected a group which comprises metals and the alloys thereof, noble metals and the alloys thereof, metal oxides and doped polymers. The first and/or second electrode may, for example, comprise indium-tin oxide (ITO) or aluminum or $AlMg_3{}_3$. Any other desired metals are, however, also possible as the material for the first and/or second electrode. The first electrically semiconductive layer 3 comprises a matrix material and a dopant. The matrix material may comprise organic materials which exhibit electron donor functions and may be selected from a group which comprises phenanthroline derivatives, imidazole derivatives, thiazole derivatives, oxadiazole derivatives, phenyl-containing compounds, compounds with fused aromatics, carbazole-containing compounds, fluorene derivatives, spirofluorene derivatives and pyridine-containing compounds and any desired combinations of the stated materials. Examples of such matrix materials are Bphen, BCP, TPBi, TAZ, Bu-PBD, DPVBi, rubrene, α-NPD (NPB), 1-TNATA, CBP, BCzVBi, it also being possible to use rubrene and BCzVBi as emitting materials. The dopant comprises rhenium compounds, which may be rhenium oxide, organometallic derivatives of rhenium oxides and rhenium oxyhalides and mixtures thereof. The dopant may comprise $Re_2O_7$. The dopant may furthermore comprise an $ReO_3$ unit, to which is bound a residue M which may be organic. Residue M may be σ-bound to the $ReO_3$ unit. In this case, residue M comprises saturated aliphatic groups, unsaturated aliphatic groups, aromatics, anions of carboxylic acids, halogens, stannyl residues and silyl residues. The aliphatic groups, aromatics and anions of carboxylic acids may furthermore comprise substituents. Residue M may be π-bound to the $ReO_3$ unit. In this case, residue M may be unsubstituted or substituted cyclopentadienyl $(C_5R_xH_{5-x})$, wherein x=1-5 and R may mutually independently be a methyl, ethyl and phenyl residue. The dopant and the matrix material form a complex. The latter is distinguished by particular temperature stability up to 400° C. together with ready sublimability and processability. The molar ratio of matrix material to dopant may be varied between 0.001 and 1 as required. The molar ratio of matrix to dopant may furthermore be varied within the electric semiconductive layer 3, such that a gradient is obtained. The electric semiconductive layer 3 may comprise a charge transport/charge injection layer, for example, a hole transport/hole injection layer. The first electrode 2 may furthermore be connected as the anode. The organic functional layer 4 may comprise a light-emitting layer. The electric organic component shown in FIG. 1 may be a light-emitting diode. It may furthermore comprise a field-effect transistor, a solar cell or photodetectors. In the case of a field-effect transistor, a source electrode, a gate electrode and a drain electrode are present (not shown here), wherein the source and drain electrodes are doped and an undoped or doped semiconductor is located between them.

The introduction of rhenium compounds, for example, rhenium oxo compounds, as p-dopants in the electrically semiconductive layer 3 leads to improved conductivity values of the electrically semiconductive layer and to stable p-doping, which increases the efficiency and service life of the component and allows the material of the first and/or second electrode to be independently selected.

Figure 2:
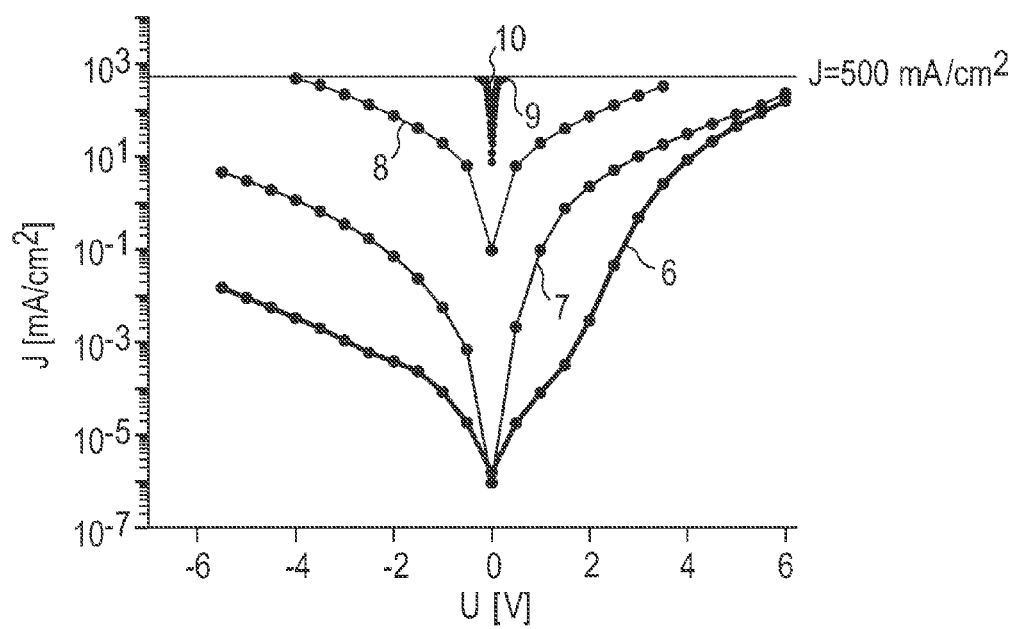
FIG. 2 shows current-voltage characteristic lines of electrically semiconductive layers with different levels of doping with rhenium oxo compounds.
Figure 3A:
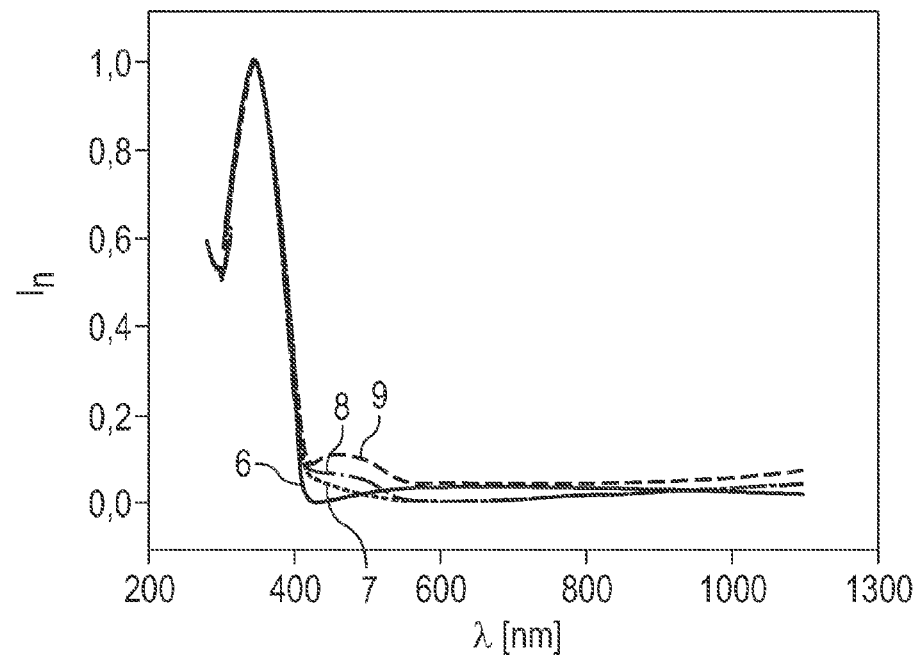
FIG. 3a shows UV/VIS spectra of electrically semiconductive layers with different levels of doping with rhenium oxo compounds.
Figure 3B:
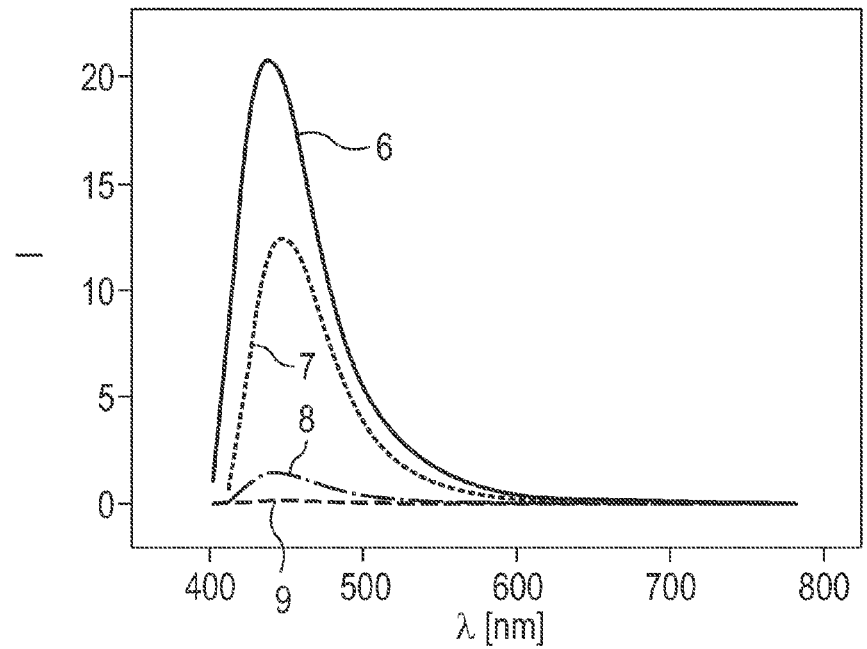
FIG. 3b shows photoluminescence spectra of electrically semiconductive layers with different levels of doping with rhenium oxo compounds.
Figure 4:
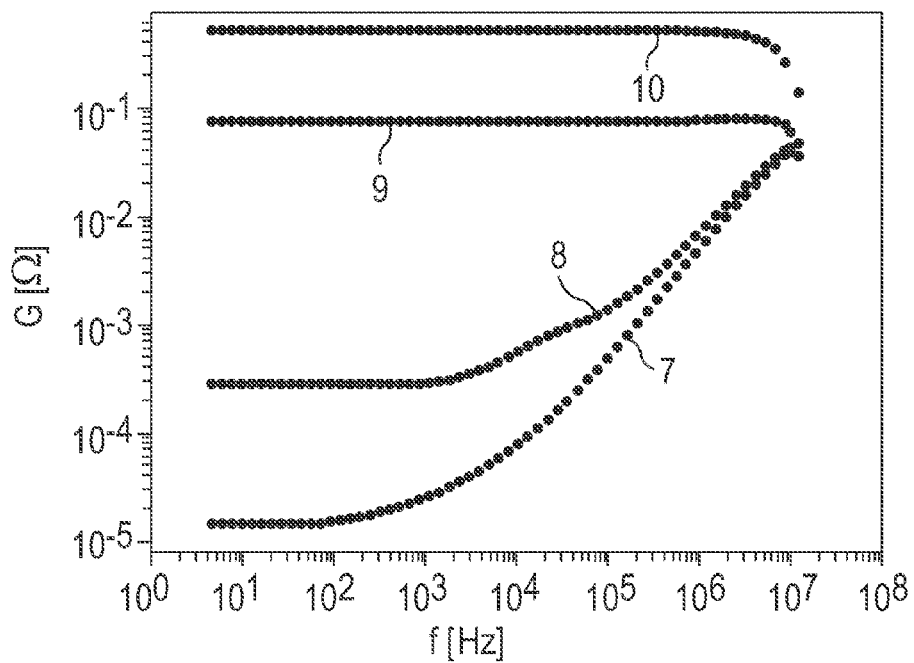
FIG. 4 shows impedance spectra of electrically semiconductive layers with different levels of doping with rhenium oxo compounds.

FIGS. 2 to 4 show the electrical properties of doped electrically semiconductive layers, while FIGS. 5 to 8 show the electrical properties of light-emitting diodes which comprise a doped electrically semiconductive layer.

FIG. 2 shows the current-voltage characteristic line for electrically semiconductive layers which comprise differing concentrations of dopant $Re_2O_7$ in the NPB matrix material. The NPB layers doped with $Re_2O_7$ are located between an ITO anode and an Al cathode which in each case have a thickness of approx. 100 to 150 nm. Curve 6 shows the current-voltage characteristic line of an undoped electrically semiconductive layer of the NPB matrix material between the ITO anode and Al cathode. The curve designated 7 shows the current-voltage characteristic line of an electrically semiconductive layer of NPB, which is doped with 1% $Re_2O_7$, arranged between the electrodes. In the curve designated 8, the electrically semiconductive layer is doped with 10% $Re_2O_7$ and with 50% in the curve designated 9, while in the curve designated 10 the electrically semiconductive layer consists 100% of $Re_2O_7$. All the electrically semiconductive layers with different levels of doping, whose current-voltage characteristic lines are shown in curves 6 to 10, have a thickness of 150 nm. The undoped electrically semiconductive layer, whose current-voltage characteristic line is shown in curve 6, serves as a reference value. In FIG. 2, current density J is plotted as a function of voltage U. Measurement was ceased at a current density J of 500 mA/cm$^2$ so as not to destroy the component thermally. This limit value is likewise shown on the diagram. As voltage U increases, current density rises, both for growing positive voltages (in which case the ITO electrode acts as the charge injection layer) and for growing negative voltages (in which case the Al electrode acts as the charge injection layer). It can clearly be seen that the initial values at a voltage of 0 volt rise with an increasing level of doping. The rise in current density J at an applied voltage rises all the faster, the higher is the level of doping in the electrically semiconductive layer. For example, 10% rhenium oxide doping in the electrically semiconductive layer improves conductivity at 2 volts by five decades in comparison with the undoped reference layer (curve 6). Pure rhenium oxide (curve 10) exhibits the highest current densities.

FIG. 3a shows the UV/VIS-spectra 6, 7, 8 and 9 of the particular electrically semiconductive layers, in which the normalized intensity $I_n$ is plotted against wavelength λ. The semiconductive layers are located on a glass sheet for measurement. Spectrum 6 describes the absorption of an undoped electrically semiconductive layer of the NPB matrix material. Spectrum 7 shows the absorption of an electrically semiconductive layer of NPB which is doped with 1% $Re_2O_7$. In the spectrum designated 8, the electrically semiconductive layer is doped with 10% $Re_2O_7$ and with 50% in the spectrum designated 9. All the spectra exhibit a peak at approx. 350 nm which is not modified by an increased level of doping with $Re_2O_7$. However, at increasingly high levels of doping in the electrically semiconductive layer, the spectra exhibit an increasingly higher absorption peak at wavelengths of between 450 nm and 550 nm. This absorption peak is the result of charge transfer in the electrically semiconductive layer and shows that a charge transfer complex is formed between the $Re_2O_7$ and the NPB matrix material. Since this peak is particularly small in comparison with other dopants (not shown here), this demonstrates the favorable action of $Re_2O_7$ as a dopant. The spectrum, which is not shown here, for a 100% $Re_2O_7$ layer as the electrically semiconductive layer shows no absorption. FIG. 3a shows that the light absorption of NPB remains unchanged by doping with rhenium oxide.

FIG. 3b shows photoluminescence spectra 6, 7, 8 and 9 of the electrically semiconductive layers, in which intensity I is plotted against wavelength λ. The excitation wavelength is 344 nm. The semiconductive layers are located on a glass sheet for measurement. Spectrum 6 describes the photoluminescence of an undoped electrically semiconductive layer of the NPB matrix material. The spectrum designated 7 shows the photoluminescence of an electrically semiconductive layer of NPB which is doped with 1% $Re_2O_7$. In the spectrum designated 8, the electrically semiconductive layer is doped with 10% $Re_2O_7$ and with 50% in the spectrum designated 9. The spectra show that, at increasingly high levels of doping in the electrically semiconductive layer, the intensity of the peak maximum at approx. 450 nm declines. This means that $Re_2O_7$ quenches or reduces the fluorescence of NPB at an increasing doping rate.

FIG. 4 shows impedance spectra 7, 8, 9 and 10 of the electrically semiconductive layers, in which the conductance value G in 1/Ω is plotted against frequency f in Hz. The semiconductive layers are located on a glass sheet for measurement. The conductance value G relates to conductivity $\sigma_{dc}$ as follows:

$$\sigma_{dc} = \lim_{f \to 0} G \cdot A / d$$

in which $\sigma_{dc}$ is the conductivity in S/cm, G the conductance value in 1/Ω, A the area in $cm^2$ and d the distance in cm. It can clearly be seen that spectrum 10, which is assigned to the electrically semiconductive layer of 100% $Re_2O_7$, exhibits the highest conductance value G. Lower levels of doping (spectra 9, describing a layer with 50% doping, 8 and 7) have lower conductance values G, while at a doping level of 1% (7) or 10% (8) the conductance values only rise at frequencies of greater than $10^4$ Hz. This shows that doping improves conductivity in the electrically semiconductive NPB layer. Conductivity values as a function of various doping levels are stated in Table 1:

TABLE 1

| $Re_2O_7$ concentration | $\sigma_{dc}$ [S/cm] |
|---|---|
| 1% | $5.86 \cdot 10^{-09}$ |
| 10% | $1.11 \cdot 10^{-07}$ |
| 50% | $3.00 \cdot 10^{-05}$ |
| 100% | $2.06 \cdot 10^{-04}$ |

Figure 5:
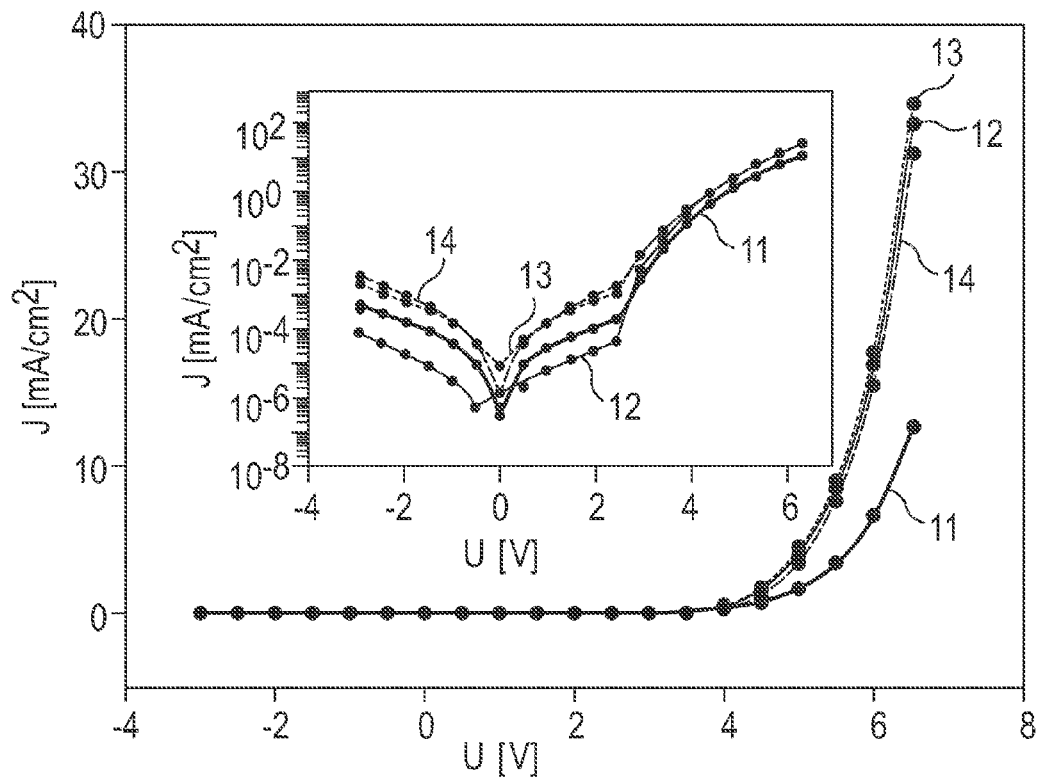
FIG. 5 shows current-voltage characteristic lines of various light-emitting diodes plotted linearly and logarithmically.

FIG. 5 shows the current-voltage characteristic line of light-emitting diodes with a doped electrically semiconductive layer. The light-emitting diodes contain an ITO anode of a thickness of 150 nm, a 40 nm thick electrically semiconductive layer of doped or undoped NPB, a 20 nm thick radiation-emitting layer of CBP, which is doped with 11% $Ir(ppy)_3$, an electron injection layer of BCP of a thickness of 40 nm, a cathode of a 0.7 nm thick LiF layer and a 100 nm thick Al layer. The electrically semiconductive layer consists 100% of NPB (curve designated 11), of a 20 nm thick NPB layer doped with 10% $Re_2O_7$ and a 20 nm thick pure NPB layer (curve designated 12), of a 20 nm thick NPB layer doped with 50% $Re_2O_7$ and a 20 nm thick NPB layer (curve designated 13), and of a 20 nm thick 100% $Re_2O_7$ layer and a 20 nm thick NPB layer (curve designated 14). In the current-voltage characteristic line of the light-emitting diodes, current density J is plotted linearly against voltage U in FIG. 5 and logarithmically in the inset in FIG. 6. Here too, in particular in the logarithmic plot, a distinct improvement in conductivity is evident at increasing levels of doping. Lower voltages produce higher currents, so leading to a higher light yield and thus to an improvement in efficiency. The highest current densities are exhibited by the electrically semiconductive layers with 50% doping (curve 13) or with 100% $Re_2O_7$ in the electrically semiconductive layer (curve 14).

Figure 6:
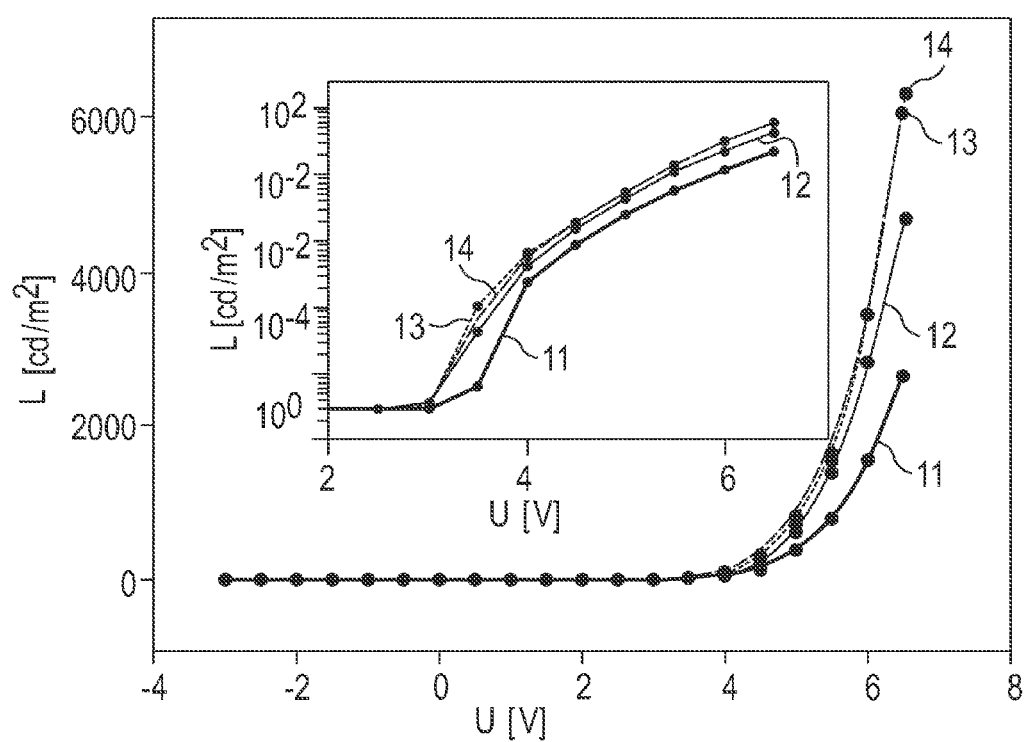
FIG. 6 shows the luminance as a function of voltage of various light-emitting diodes plotted linearly and logarithmically.

FIG. 6 shows luminance values in $cd/m^2$ as a function of voltage in V of the light-emitting diodes 11 (100% NPB), 12 (10% doping), 13 (50% doping) and 14 (100% $Re_2O_7$). Both a linear and a logarithmic plot are shown. Here too it can again be seen that higher luminance values are reached more rapidly at higher doping levels of the electrically semiconductive layer.

Figure 7A:
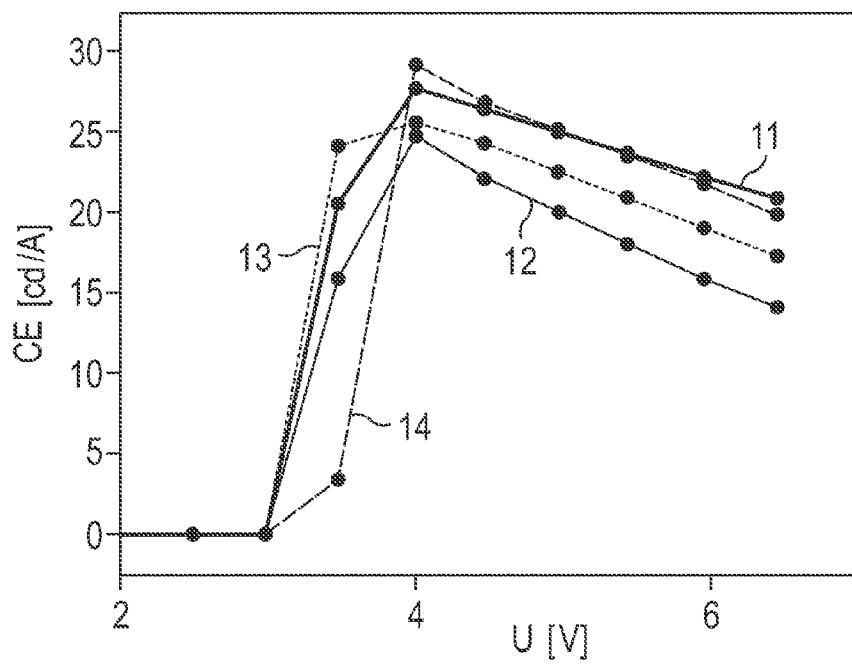
FIG. 7a shows current efficiency as a function of voltage of various light-emitting diodes.

FIG. 7a plots current efficiency $C_E$ against voltage U for the light-emitting diodes already stated above (curves 11, 12, 13 and 14). Especially at high voltages U, the doped light-emitting diodes can be seen to exhibit improved current efficiency $C_E$.

Figure 7B:
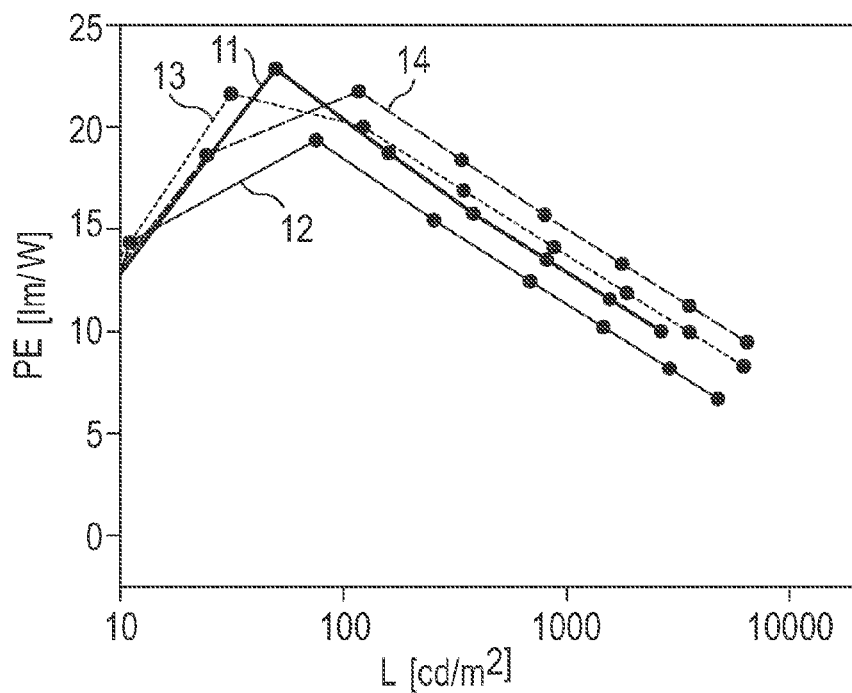
FIG. 7b shows the power efficiency of various light-emitting diodes as a function of luminescence.

FIG. 7b plots power efficiency $P_E$ against luminescence L for the above-stated light-emitting diodes (curves 11, 12, 13 and 14). Especially at elevated luminance values, curves 13 and 14 can be seen to exhibit improved power efficiency $P_E$. Here too, doping of the electrically semiconductive layer can be seen to have a positive impact.

Figure 8:
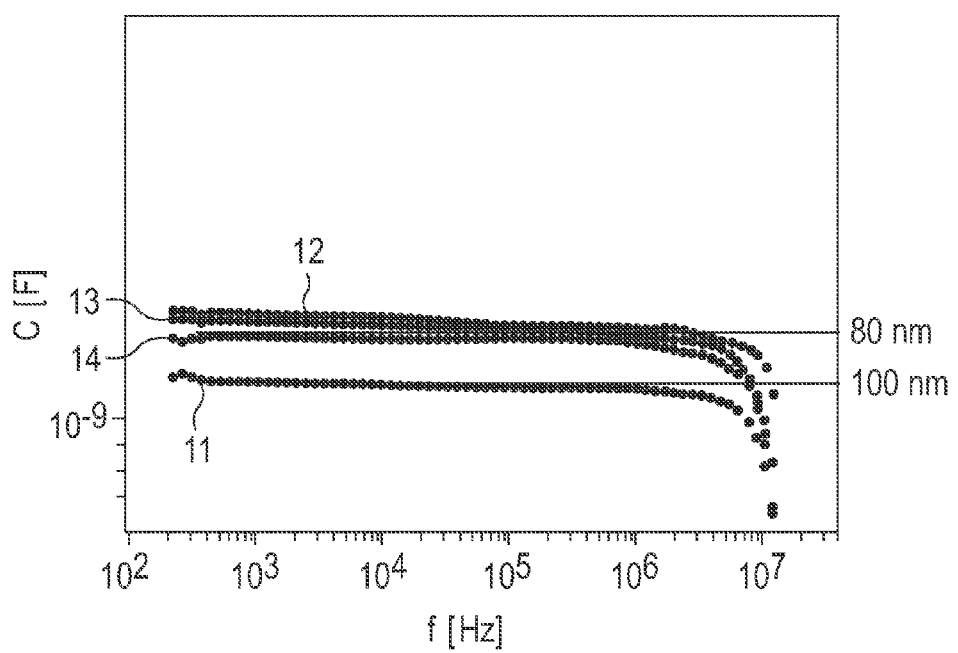
FIG. 8 shows capacitance as a function of frequency of various light-emitting diodes.

FIG. 8 shows impedance measurements 11, 12, 13 and 14 for the above-described light-emitting diodes. The alternating voltage is 0.1 V, the direct voltage is 0 V. The dielectric constant $\in_0$ amounts to 3.3, the area A which was measured amounts to 0.04 $cm^2$. The capacitance C against frequency f plot is shown for all the light-emitting diodes. Assuming a nominal layer thickness of the undoped NPB layer of 100 nm (drawn on the plot), it can be seen that the doped light-emitting diodes exhibit a difference relative to the nominal layer thickness of 20 nm. All the doped light-emitting diodes have an intrinsic layer thickness of 80 nm. This may be interpreted as an indication of good conductivity. Since the doped light-emitting diodes comprise a larger number of intrinsic charge carriers, they become so to speak electrically "invisible", layer thickness thereby becoming smaller.

The production of a light-emitting diode with an electrically semiconductive layer will be described as an exemplary embodiment. 500 mg of $Re_2O_7$ are introduced under a vacuum atmosphere into a heatable container. NPB is introduced into a second container. A glass sheet of dimensions 60 mm×60 mm, which is covered with a textured ITO electrode, is fastened to a substrate holder at a distance of approx. 25 cm from the two containers. NPB is deposited on the ITO electrode at a rate von 1 nm/s from the container containing NPB, while $Re_2O_7$ is deposited at a rate of 0.1 nm/s from the container containing $Re_2O_7$. This ratio of deposition rates gives rise to a ratio of matrix to dopant of 10:1. A 30 nm thick NPB layer which is doped with $Re_2O_7$ is deposited in this manner. A pure 10 nm thick NPB layer is then additionally deposited on the doped NPB layer. Further organic functional layers and a cathode may subsequently be deposited in known manner by vapor deposition. This example of producing a light-emitting diode may be varied at will. For example, the ratio of matrix to dopant may amount to 1:1 or 1000:1. Instead of NPB, it is possible to use Bphen, TAZ or naphthalene tetracarboxylic anhydride as the matrix. Instead of $Re_2O_7$, it is also possible to use methyltrioxo rhenium, cyclopentadienyltrioxo rhenium or pentamethylcyclopentadienyloxo rhenium as the dopant. A stream of gas may furthermore be used for deposition on the ITO electrode. With regard to the concentration of dopant in the matrix, deposition may be adjusted such that a gradient of the matrix to dopant ratio from 10:1 to 10000:1 is produced. The pure BCP layer may also be omitted. Finally, creation of the electrically semiconductive layer may also be begun on the cathode, so giving rise to a top-emitting light-emitting diode.

The examples shown in FIGS. 1 to 8 and the exemplary embodiments for production may be varied at will. It should furthermore be borne in mind that the invention is not restricted to these examples, but instead permits further developments which are not listed here.

The invention claimed is:

1. An electric organic component comprising
a substrate,
a first electrode,
an electrically semiconductive layer on the first electrode, the electrically semiconductive layer comprising a matrix material and being doped with a dopant that comprises rhenium compounds, wherein the dopant is present in the matrix material, wherein the dopant and the matrix material form a complex and wherein the dopant comprises an $ReO_3$ unit to which is bound a residue M,
an organic functional layer on the electrically semiconductive layer, and
a second electrode on the organic functional layer, wherein either the first electrode or the second electrode is arranged on the substrate.

2. The component according to claim 1, wherein the matrix material is p-doped by the dopant.

3. The component according to claim 1, wherein the matrix material is hole conductive.

4. The component according to claim 1, wherein the matrix material comprises a material selected from the group consisting of phenanthroline derivatives, imidazole derivatives, thiazole derivatives, oxadiazole derivatives, phenyl-containing compounds, compounds with fused aromatics, carbazole-containing compounds, fluorene derivatives, spirofluorene derivatives and pyridine-containing compounds and any desired combinations of the stated materials.

5. The component according to claim 1, wherein the rhenium compounds comprise compounds selected from the group consisting of rhenium oxides, organometallic derivatives of rhenium oxides and rhenium oxyhalides and mixtures thereof.

6. The component according to claim 1, wherein residue M is σ-bound to the $ReO_3$ unit.

7. The component according to claim 1, wherein residue M is selected from the group consisting of branched or unbranched saturated aliphatic groups, branched or unbranched unsaturated aliphatic groups, aromatics, anions of carboxylic acids, halogens, stannyl residues and silyl residues.

8. The component according to claim 1, wherein residue M is π-bound to the $ReO_3$ unit.

9. The component according to claim 1, wherein the electrically semiconductive layer comprises a charge transport/charge injection layer.

10. The component according to claim 1, wherein the first electrode comprises an anode.

11. The component according to claim 1, wherein the material of the first electrode comprises a material selected from the group consisting of metals, metal alloys, noble metals, noble metal alloys, metal oxides and doped polymers and combinations thereof.

12. The component according to claim 1, wherein the component is designed as a field-effect transistor, solar cell or photodetector.

13. The component according to claim 1, wherein the component comprises a light-emitting diode.

14. The component according to claim 1, further comprising a second electrically semiconductive layer between the organic functional layer and the second electrode.

15. The component according to claim 7, wherein residue M is selected form the group consisting of branched or unbranched saturated aliphatic groups, branched or unbranched unsaturated aliphatic groups, aromatics, anions of carboxylic acids, the aliphatic groups, aromatics and anions of carboxylic acids comprise substituents.

16. The component according to claim 8, wherein residue M comprises unsubstituted or substituted cyclopentadienyl.

17. The component according to claim 9, wherein the charge transport/charge injection layer comprises a hole transport/hole injection layer.

18. The component according to claim 13, wherein the organic functional layer comprises a radiation-emitting layer.

19. The component according to claim 16, wherein residue M comprises substituted cyclopentadienyl, wherein the substituted cyclopentadienyl comprises substituents that are selected from the group which mutually independently comprises alkyl groups and aryl groups.

20. A method for making an electric organic component, the method comprising:
providing a substrate,
forming a functional layer arrangement on the substrate, wherein the layer arrangement comprises a first electrode, a first electrically semiconductive layer with a matrix material and rhenium compounds as dopants, wherein the dopants are present in the matrix material, wherein the dopants and the matrix material form a complex and wherein the dopants comprise an $ReO_3$ unit to which is bound a residue M, arranged on the first electrode, an organic functional layer arranged on the first electrically semiconductive layer, and a second electrode arranged on the functional layer.

21. The method according to claim 20, wherein producing the functional layer arrangement comprises:
forming the first electrode on the substrate,
forming the electrically semiconductive layer with the matrix material and rhenium compounds as dopants on the first electrode,
forming the organic functional layer on the first electrically semiconductive layer, and
forming the second electrode on the organic functional layer.

22. The method according to claim 20, further comprising depositing a first undoped electrically semiconductive layer on the doped electrically semiconductive layer.

23. The method according to claim 20, further comprising depositing further functional layers.

24. The method according to claim 20, wherein providing a substrate comprises providing a glass substrate.

25. The method according to claim 20, wherein the first electrode is connected as an anode.

26. The method according to claim 20, wherein the first electrode is connected as a cathode.

27. The method according to claim 21, wherein forming the electrically semiconductive layer comprises simultaneously depositing the dopant and the matrix material on the first electrode.

28. The method according to claim 21, wherein the electrically semiconductive layer is deposited with a layer thickness of 30 nm.

29. The method according to claim 22, wherein the first undoped electrically semiconductive layer is deposited with a film thickness of 10 nm.

30. The method according to claim 27, wherein a ratio between dopant and matrix material is established by means of a ratio between a deposition rate of the dopant and a deposition rate of the matrix material.

* * * * *